(12) United States Patent
Li et al.

(10) Patent No.: US 9,461,094 B2
(45) Date of Patent: Oct. 4, 2016

(54) SWITCHING FILM STRUCTURE FOR MAGNETIC RANDOM ACCESS MEMORY (MRAM) CELL

(71) Applicant: QUALCOMM Incorporated, San Diego, CA (US)

(72) Inventors: Xia Li, San Diego, CA (US); Wei-Chuan Chen, Taipei (TW); Yu Lu, San Diego, CA (US); Kangho Lee, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/334,554

(22) Filed: Jul. 17, 2014

(65) Prior Publication Data
US 2016/0020250 A1 Jan. 21, 2016

(51) Int. Cl.
*G11C 11/00* (2006.01)
*H01L 27/22* (2006.01)
*H01L 43/08* (2006.01)
*G11C 11/16* (2006.01)

(52) U.S. Cl.
CPC ........... *H01L 27/224* (2013.01); *G11C 11/161* (2013.01); *G11C 11/1659* (2013.01); *G11C 11/1675* (2013.01); *H01L 27/228* (2013.01); *H01L 43/08* (2013.01); *G11C 2213/73* (2013.01)

(58) Field of Classification Search
CPC G11C 11/16; G11C 11/15; G11C 2211/5614

USPC ................. 365/158, 171, 173, 175
See application file for complete search history.

(56) References Cited

U.S. PATENT DOCUMENTS

| | | | |
|---|---|---|---|
| 7,173,846 B2 | 2/2007 | Lin et al. | |
| 8,451,655 B2 | 5/2013 | Chung et al. | |
| 8,466,525 B2 | 6/2013 | Zheng et al. | |
| 2003/0116847 A1 | 6/2003 | Kim | |
| 2011/0090732 A1* | 4/2011 | Li | G11C 11/16 365/158 |
| 2013/0039121 A1 | 2/2013 | Lee | |
| 2013/0058156 A1 | 3/2013 | Ohno et al. | |
| 2013/0270510 A1 | 10/2013 | Fujii et al. | |
| 2013/0334632 A1* | 12/2013 | Park | ............. 257/421 |
| 2014/0103471 A1 | 4/2014 | Lupino et al. | |
| 2014/0138599 A1* | 5/2014 | Fujii et al. | ........... 257/2 |
| 2015/0070983 A1* | 3/2015 | Kumura | ........... 365/158 |
| 2015/0249096 A1* | 9/2015 | Lupino | H01L 27/11898 257/203 |

OTHER PUBLICATIONS

International Search Report and Written Opinion—PCT/US2015/032249—ISA/EPO—Jul. 16, 2015.

* cited by examiner

*Primary Examiner* — Huan Hoang
(74) *Attorney, Agent, or Firm* — Seyfarth Shaw LLP

(57) ABSTRACT

An MRAM cell may include a magnetic tunneling junction (MTJ). The MTJ includes a pin layer, a barrier layer, a free layer, and a capping layer. The MRAM cell further includes a bidirectional diode selector, directly coupled to an electrode of the MTJ, to enable access to the MTJ.

18 Claims, 18 Drawing Sheets

SWITCHING FILM STRUCTURE FOR MAGNETIC RANDOM ACCESS MEMORY (MRAM) CELL

BACKGROUND

1. Field

Aspects of the present disclosure relate to semiconductor devices, and more particularly to magnetic random access memory (MRAM) structures.

2. Background

Magnetic structures for memory provide improved memory storage. The access transistor for magnetic random access memory (MRAM) structures, however, usually dominates the cell area of the memory. As such, the MRAM density is limited by the access transistors, rather than the memory storage, which limits the scaling of MRAM structures to smaller geometries.

SUMMARY

A magnetic random access memory (MRAM) may include a magnetic tunneling junction (MTJ). The MTJ includes a pin layer, a barrier layer, a free layer, and a capping layer. The MRAM cell further includes a bidirectional diode selector, directly coupled to an electrode of the MTJ, to enable access to the MTJ.

A magnetic random access memory (MRAM) cell may include means for magnetically storing a data bit. Such an MRAM cell also includes means for accessing the storing means. The means for accessing can be directly coupled to the storing means.

A method for storing data in a magnetic random access memory (MRAM) cell may include storing a data bit in a magnetic tunneling junction (MTJ) device. The method also includes accessing the MTJ device with a bidirectional diode selector directly coupled to an electrode of the MTJ.

This has outlined, rather broadly, the features and technical advantages of various aspects of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of described aspects of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

Figure 1:
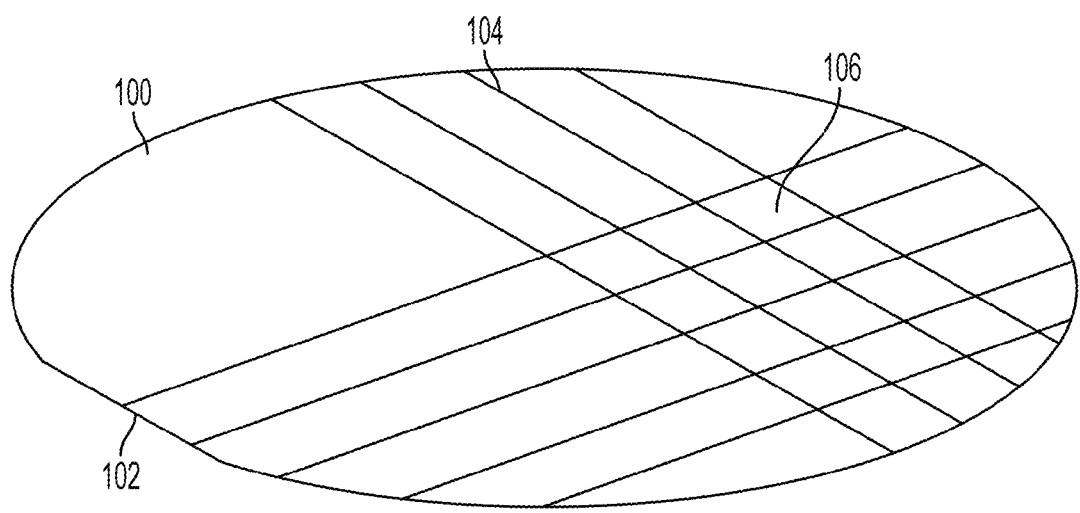
FIG. 1 illustrates a perspective view of a semiconductor wafer in an aspect of the present disclosure.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs), gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to change silicon to n-type or p-type for electrical charge to flow in the wafer 100. These additives are referred to as dopants, and provide extra charge carriers (either electrons or holes) induced by n-type or p-type silicon within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystal orientation of the wafer 100. The orientation 102 may be a flat edge of the wafer 100 as shown in FIG. 1, or may be a notch or other indicia to illustrate the crystal orientation of the wafer 100. The orientation 102 may indicate the Miller Indices for the planes of the crystal lattice in the wafer 100.

The Miller indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be desired to adequately describe the different crystallographic planes.

Once the wafer 100 is processed as desired, the wafer 100 is divided up using dicing lines 104. The wafer 100 may be sawn or otherwise separated into pieces to form the die 106. Each of the die 106 may be an integrated circuit with many devices or may be a single electronic device. The physical size of the die 106, which may also be referred to as a chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that access the die 106. The die 106 may also be directly accessed through wire bonding, probes, or other connections without mounting the die 106 into a separate package.

Figure 2:
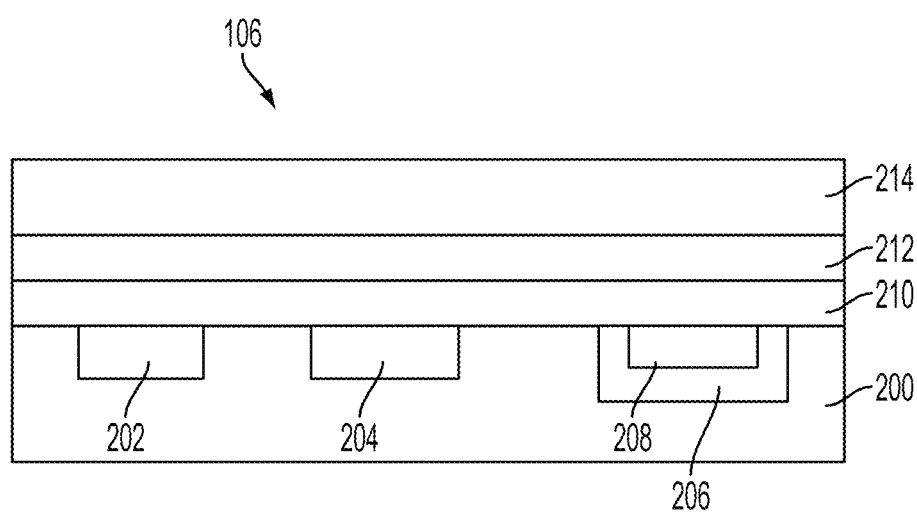
FIG. 2 illustrates a cross-sectional view of a die in accordance with an aspect of the present disclosure.

FIG. 2 illustrates a cross-sectional view of a die in accordance with an aspect of the present disclosure. Representatively, the die 106 may include a substrate 200, which may be a semiconductor material and/or may act as a mechanical support for electronic devices. The substrate 200 may be a doped semiconductor substrate, which has either electrons (designated n-type) or holes (designated p-type) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may support fin structures of a fin structured FET (FinFET). Wells 202 and/or 204 may also support other devices (e.g., a resistor, a capacitor, a diode, or other electronic devices) depending on the structure and other characteristics of the wells 202 and/or 204 and the surrounding structure of the substrate 200.

The semiconductor substrate may also have wells 206 and 208. The well 208 may be completely within the well 206, and, in some cases, may form a bipolar junction transistor (BJT). The well 206 may also be used as an isolation well to isolate the well 208 from electric and/or magnetic fields within the die 106.

Layers 210 through 214 may be added to the die 106. The layer 210 may be, for example, an oxide or insulating layer that may isolate the wells 202-208 from each other or from other devices on the die 106. In such cases, the layer 210 may be silicon dioxide, a polymer, a dielectric, or another electrically insulating layer.

The layer 212 may also be an interconnection layer, in which case it may comprise a conductive material such as copper, tungsten, aluminum, an alloy, or other conductive or metallic materials. The layer 212 may also be a conductive layer, depending on the desired device characteristics and/or the materials of the layers 210 and 214. The layer 214 may be an encapsulating layer, which may protect the layers 210 and 212, as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers 210-214. For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers 210-214, and through selective removal, material selection, and dopant concentration of the substrate 200 and the wells 202-208, many different structures and electronic devices may be formed within the scope of described aspects of the present disclosure.

Further, the substrate 200, the wells 202-208, and the layers 210-214 may be selectively removed or added through various processes. Chemical wet etching, chemical mechanical planarization (CMP), plasma etching, photoresist masking, damascene processes, and other methods may create the structures and devices of the described aspects of the present disclosure.

Figure 3:
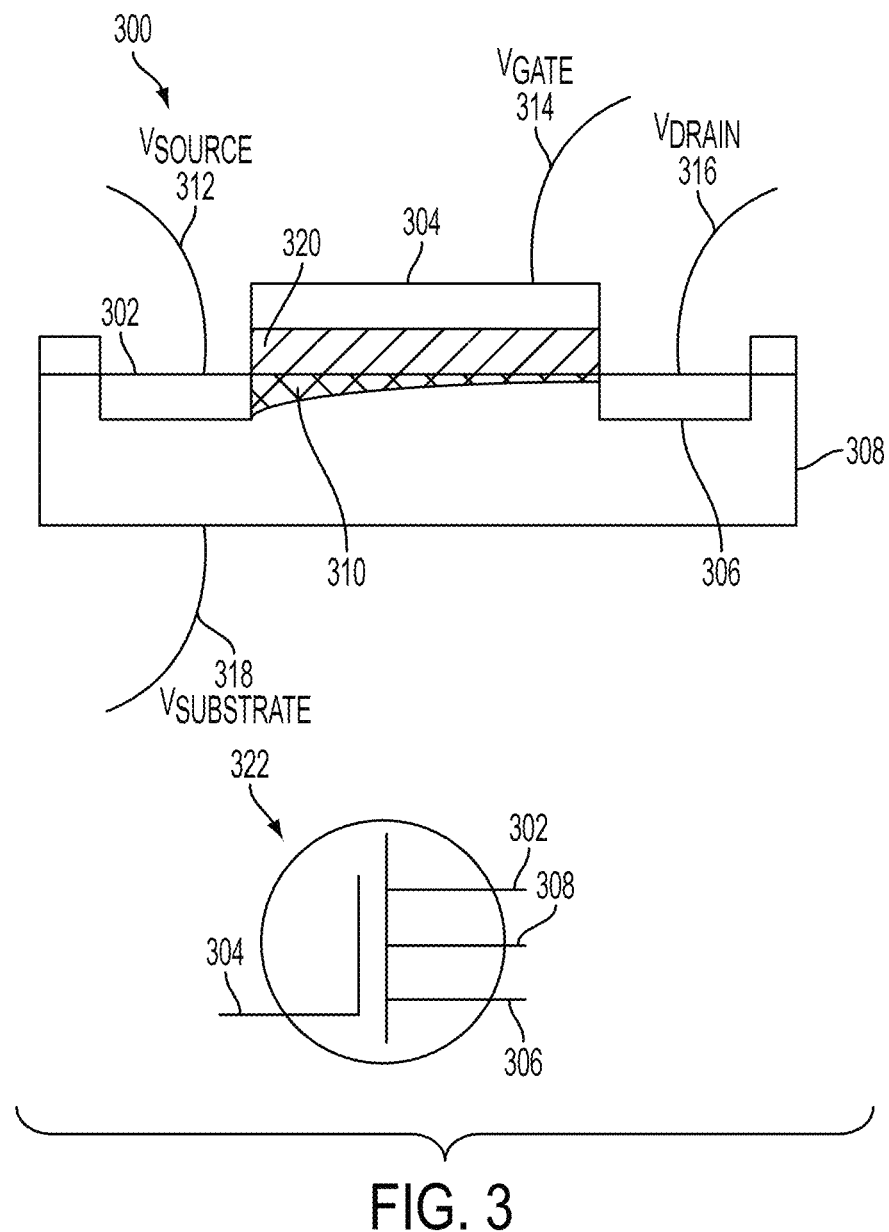
FIG. 3 illustrates a cross-sectional view of a metal-oxide-semiconductor field-effect transistor (MOSFET) device in an aspect of the present disclosure.

FIG. 3 illustrates a cross-sectional view of a metal-oxide-semiconductor field-effect transistor (MOSFET) device in an aspect of the present disclosure. The MOSFET 300 may have four terminals. The four terminals may include a source 302, a gate 304, a drain 306, and a substrate 308. The source 302 and the drain 306 may be fabricated as like the wells 202 and 204 in the substrate 308 by phosphorus or boron dopants in wells 202 and 204 or well 206 and 208 in substrate 308, or may be fabricated as areas above the substrate 308, or as part of other layers on the die 106 if desired. Such other structures may be a fin or other structure that protrudes from a surface of the substrate 308. Further, the substrate 308 may be the substrate 200 on the die 106, but substrate 308 may also be one or more of the layers 210-214 that are coupled to the substrate 200.

The MOSFET 300 is a unipolar device, as electrical current is produced by only one type of charge carrier (e.g., either electrons or holes) depending on the type of MOSFET. The MOSFET 300 operates by controlling the amount of charge carriers in the channel 310 between the source 302 and the drain 306. A Vsource 312 voltage is applied to the source 302, a Vgate 314 voltage is applied to the gate 304, and a Vdrain 316 voltage is applied to the drain 306. A separate Vsubstrate 318 voltage may also be applied to the substrate 308, although the Vsubstrate 318 voltage may be coupled to one of the Vsource 312, Vgate 314 or Vdrain 316 voltages.

To control the charge carriers in the channel 310, the Vgate 314 voltage creates an electric field in the channel 310 when the gate 304 in inversion mode. The inversion charge under the gate 304 begins to be inversed in the channel 310. The gate insulator 320 insulates the charges on the gate 304 from the source 302, the drain 306, and the channel 310. The gate 304 and the channel 310 create a capacitor, and as the Vgate 314 voltage increases, eventually enough inversion charges occur in the channel 310 to provide an electrically conductive path between the source 302 and the drain 306. This condition may be referred to as opening the channel of the FET.

By changing the Vsource 312 voltage and Vdrain 316 voltage, and their relationship to the Vgate 314 voltage, the amount of voltage applied to the gate 304 to open the channel may be fixed. For example, the Vsource 312 voltage is usually of a lower potential than that of the Vdrain 316 voltage. Making the voltage differential between the Vsource 312 and the Vdrain 316 voltages and the amount of the Vgate 314 to Vsource 312 voltage is above a threshold voltage to open the channel 310. Further, a larger voltage differential between source 302 and drain 306 will apply the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the described aspects of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET 300 is also illustrated. For n-type MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

Interconnect traces or layers may be used to interconnect the MOSFET 300 to other devices in a semiconductor die. These interconnect traces may be in one or more of layers 210-214, or may be in other layers of the semiconductor die.

Some interconnects in semiconductor products may be "unidirectional," in that the traces on a given interconnect level only travel in one direction. For example, one interconnect layer may have traces that run horizontally, and another interconnect layer may have traces that run vertically. The interconnect layers may be connected using vertical interconnections (e.g., vias) such that the traces from the interconnect layers may overlap each other and are only connected at the vertical connection sites.

When semiconductor devices are scaled to smaller geometries, the interconnect traces are also scaled to smaller sizes. This scaling may create problems with the interconnect layers because the resistance of the interconnect traces is inversely proportional to the cross-sectional area of the interconnect trace. As resistance increases, the performance of the overall circuit may change, (more specifically degrade) which may affect proper operation of the circuit. As such, scaling the interconnect traces results in a design trade-off between performance of the circuit and the density of the traces that connect the underlying devices.

Design libraries may be used to create the overall circuit, and to ensure design of an overall circuit, such as a memory or processor. These design libraries have pre-organized groups of devices, which may be called cells, where each cell has a specified function such as a memory gate, a group of memory gates, an electromagnetic pulse (EMP) protection device, and other devices.

Circuit designers place various numbers and types of cells together to create the overall circuit. Depending on the cell function, the cell may have different dimensions. One of these dimensions may be referred to as the cell height. The cell height may be dependent upon any number of variables, including the number and types of devices, the overall geometry, and/or the function of the cell, among other things.

The interconnect dimensions, including the width of the interconnect traces, the spacing between the interconnect traces, and the overall cell height of the interconnect trace cell may differ from the cell height to which the interconnect traces connect. Further, the interconnect traces may be designed on a grid pattern within the interconnect cell height to maintain uniformity between interconnections from one type of device cell to another and to maintain device yield within fabrication process tolerances.

Magnetic Random Access Memory Devices

Unlike conventional random access memory (RAM) chip technologies, in magnetic RAM (MRAM) data is stored by magnetic polarization (moment) of storage elements. The storage elements are formed from two ferromagnetic layers separated by a tunneling barrier layer. One of the two ferromagnetic layers, which is referred to as the fixed (e.g., pinned) layer, has a magnetization that is fixed in a particular direction. The other ferromagnetic magnetic layer, which is referred to as the free layer, has a magnetization direction that can be altered to two different states (parallel or anti-parallel). One such device having a fixed layer, a tunneling barrier layer, and a free layer is a magnetic tunnel junction (MTJ).

In an MTJ, the different states of the free layer may be used to represent either a logic "1" or a logic "0". In particular, the electrical resistance of an MTJ depends on whether the free layer magnetization and fixed layer magnetization are parallel or anti-parallel with each other. For example, a logic "1" state is represented when the free layer magnetization is anti-parallel to the fixed layer magnetization. A logic "0" state is represented when the free layer magnetization is parallel to the fixed layer magnetization. A memory device such as MRAM is built from an array of individually addressable MTJs.

To write data in a spin torque tunneling (STT) MRAM, a write current exceeding a switching current is applied through an MTJ. The write current should exceed the switching current by a sufficient amount of spin torque of switching current to change the magnetization direction of the free layer. When the write current flows in a first direction, the MTJ is placed into or remains in a first state. In the first state, a free layer magnetization direction and a fixed layer magnetization direction of the MTJ are aligned in a parallel orientation. When the write current flows in a second direction, opposite to the first direction, the MTJ is placed into or remains in a second state. In the second state, the free layer magnetization and fixed layer magnetization of the MTJ are in an anti-parallel orientation.

Materials used to form a magnetic tunnel junction (MTJ) of a magnetic random access memory (MRAM) generally exhibit high tunneling magneto resistance (TMR), high perpendicular magnetic anisotropy (PMA) and good data retention. MTJ structures may be made in a perpendicular orientation, referred to as perpendicular, magnetic tunnel junction (pMTJ) devices. A stack of materials (e.g., cobalt-iron-boron (CoFeB) materials) with a dielectric barrier layer (e.g., magnesium oxide (MgO)) may be used in a pMTJ structure. A pMTJ structure including a stack of materials (e.g., CoFeB/MgO/CoFeB) has been considered for use in MRAM structures.

This stack of materials (e.g., CoFeB/MgO/CoFeB) within the pMTJ structure may provide a specified perpendicular magnetic anisotropy (PMA). For example, the overall PMA for pMTJ including the material stack of CoFeB/MgO/CoFeB is determined by the interface between the MgO layer and CoFeB layer. Many times, a thinner CoFeB layer is favorable to increase the PMA. A thinner CoFeB layer within the pMTJ, however, reduces the TMR and the data retention of the pMTJ structure.

The data retention capability of the pMTJ structure is provided by the free layer. A dual interface (e.g., barrier MgO/CoFeB/MgO cap) in the storage layer (e.g., free layer) may improve the TMR and data retention, but still exhibit an insufficient amount of TMR. The insufficient amount of TMR is the result of the two different MgO/CoFeB interfaces within the free layer. In particular, the two different MgO/CoFeB interfaces may induce crystal orientation mismatches in the thin CoFeB layer during post-annealing.

In an aspect of the present disclosure, a magnetic tunnel junction (MTJ) device includes a free layer, a barrier layer and a fixed layer. In one configuration, the free layer interfacing with the barrier layer. In particular, the free layer has a crystal structure in accordance with the barrier layer. An amorphous capping layer interfaces with the free layer. In this configuration, the amorphous capping layer prevents crystallization at the interface with the free layer. Instead, crystallization occurs at the interface between the free layer and the barrier layer. As a result, the crystal structure of the free layer is determined by the crystal structure of the barrier layer.

Figure 4:
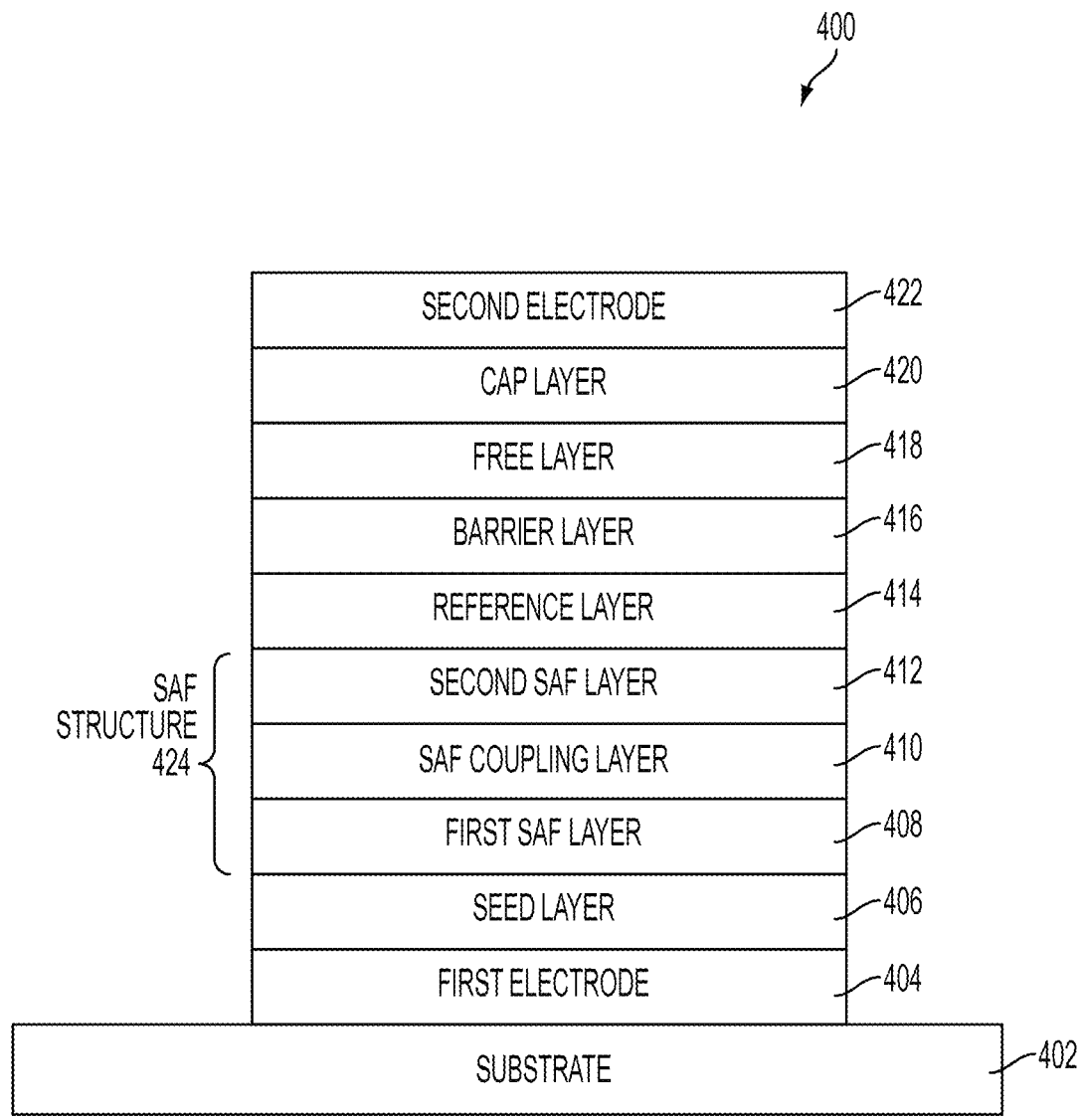
FIG. 4 illustrates a cross-sectional view of a perpendicular magnetic tunnel junction (pMTJ) structure in accordance with one aspect of the present disclosure.

FIG. 4 illustrates a cross-sectional view of a perpendicular magnetic tunnel junction (pMTJ) structure in accordance with one aspect of the present disclosure. Representatively, a pMTJ structure 400 is formed on a substrate 402. The pMTJ structure 400 may be formed on a semiconductor substrate, such as silicon substrate, or any other alternative suitable substrate material. The pMTJ structure 400 may include a first electrode 404, a seed layer 406, a first synthetic antiferromagnetic (SAF) layer 408, a SAF coupling layer 410, and a second SAF layer 412. The pMTJ structure 400 also includes a reference layer 414, a barrier layer 416, a free layer 418, a cap layer 420 (also known as a capping layer), and a second electrode 422. The pMTJ structure 400 may be used in various types of devices, such as a semiconductor memory device (e.g., a magnetic random access memory (MRAM)).

In this configuration, the first electrode 404 and the second electrode 422 include conductive materials (e.g., tantalum (Ta)). In other configurations, the first electrode 404 and/or second electrode 422 may include other appropriate materials, including but not limited to platinum (Pt), copper (Cu), gold (Au), aluminum (Al), or other like conductive materials. The first electrode 404 and the second electrode 422 may also use different materials within the pMTJ structure 400.

A seed layer 406 is formed on the first electrode 404. The seed layer 406 may provide a mechanical and crystalline substrate for the first SAF layer 408. The seed layer 406 may be a compound material, including but not limited to, nickel chromium (NiCr), nickel iron (NiFe), NiFeCr, or other suitable materials for the seed layer 406. When the seed layer 406 is grown or otherwise coupled to the first electrode 404, a smooth and dense crystalline structure results in the seed layer 406. In this configuration, the seed layer 406 promotes growth of subsequently formed layers in the pMTJ structure 400 according to a specific crystal orientation. The crystalline structure of the seed layer 406 may be selected to be any crystal orientation within the Miller Index notation system, but is often chosen to be in the (111) crystal orientation.

A first SAF layer 408 is formed on the seed layer 406. The first SAF layer 408 may be a single layer of material, or may be a multi-layer stack of materials, which is formed on the seed layer 406. The multi-layer stack of materials used for the first SAF layer 408 may be a ferromagnetic material or a combination of materials to create a ferromagnetic moment in the first SAF layer 408. The multi-layer stack of materials used form the first SAF layer 408 includes, but not limited to, cobalt (Co), cobalt in combination with other materials such as nickel (Ni), platinum (Pt), or palladium (Pd), or other like ferromagnetic materials.

An SAF coupling layer 410 is formed on the first SAF layer 408, and promotes magnetic coupling between the first SAF layer 408 and a second SAF layer 412. The SAF coupling layer 410 includes material that aides in this coupling including, but not limited to, ruthenium (Ru), tantalum (Ta), gadolinium (Gd), platinum (Pt), hafnium (Hf), osmium (Os), rhodium (Rh), niobium (Nb). Terbium (Tb), or other like materials. The SAF coupling layer 410 may also include materials to provide mechanical and/or crystalline structural support for the first SAF layer 408 and the second SAF layer 412.

The second SAF layer 412 is formed on the SAF coupling layer 410. The second SAF layer 412 may use similar materials as the first SAF layer 408, but may include other materials. The combination of the first SAF layer 408, the SAF coupling layer 410, and the second SAF layer 412 forms a SAF structure 424, which is often referred to as a "pinned layer" or "pin layer" in the pMTJ structure 400. The SAF structure 424 fixes, or pins, the magnetization direction of the SAF structure 424 through anti-ferromagnetic coupling. The SAF structure 424 may include a cobalt-iron-boron (CoFeB) film. The SAF structure 424 may also include other ferromagnetic material layers, such as CoFeTa, NiFe, Co, CoFe, CoPt, CoPd, FePt, or any alloy of Ni, Co and Fe.

A reference layer 414 is formed on the SAF structure 424. The reference layer 414 provides a crystal orientation for the barrier layer 416. As with the seed layer 406, the material used in the reference layer 414 provides a template for subsequent layers to be grown in a specific crystal orientation. This orientation may be in any direction within the Miller Index system, but is often in the (100) (or (001)) crystal orientation. The reference layer 414 may also be the last layer of the second SAF layer 412, but is shown as a separate layer for ease of explanation.

A barrier layer 416 (also referred to as a tunnel barrier layer) is formed on the reference layer 414. The barrier layer provides a tunnel barrier for electrons travelling between the SAF structure 424 and the free layer 418. The barrier layer 416, which may include magnesium oxide (MgO), is formed on the reference layer 414 and may have a crystalline structure. The crystalline structure of the barrier layer may be in the (100) direction. The barrier layer 416 may include other elements or other materials, such as aluminum oxide (AlO), aluminum nitride (AlN), aluminum oxynitride (AlON), or other non-magnetic or dielectric material. The thickness of the barrier layer 416 is formed such that electrons can tunnel from the SAF structure 424 through the barrier layer 416 to the free layer 418 when a biasing voltage is applied to the pMTJ structure 400.

The free layer 418, which may be cobalt-iron-boron (CoFeB), is formed on the barrier layer 416. The free layer 418 is also a ferromagnetic layer or multilayer material, which may be the same ferromagnetic material as the SAF structure 424 or may use different materials.

In this configuration, the free layer 418 includes a ferromagnetic material that is not fixed or pinned in a specific magnetic orientation. The magnetization orientation of the free layer 418 is able to rotate to be in a parallel or an anti-parallel direction to the pinned magnetization of the SAF structure 424. A tunneling current flows perpendicularly through the barrier layer 416 depending upon the relative magnetization directions of the SAF structure 424 and the free layer 418.

A cap layer 420 is formed on the free layer 418. The cap layer 420 may be a dielectric layer, or other insulating layer, to allow containment of the magnetic and electric fields between the free layer 418 and the SAF structure 424. The cap layer 420 helps reduce the switching current density used to switch the pMTJ structure 400 from one orientation (e.g., parallel) to the other (e.g., anti-parallel). The cap layer 420, which may also be referred to as a capping layer, may be an oxide, such as, for example, amorphous aluminum oxide (AlOx) or amorphous hafnium oxide (HfOx). The cap layer 420 may also be other materials, such as magnesium oxide (MgO) or other dielectric materials without departing from the scope of the described aspects of the present disclosure.

The second electrode 422 is formed on the cap layer 420. In one configuration, the second electrode 422 includes tantalum. Alternatively, the second electrode 422 includes any other suitable conductive material for electrical connection of the pMTJ structure 400 to other devices or portions of a circuit. Formation of the second electrode 422 on the cap layer 420 completes the pMTJ structure 400.

Figure 5:
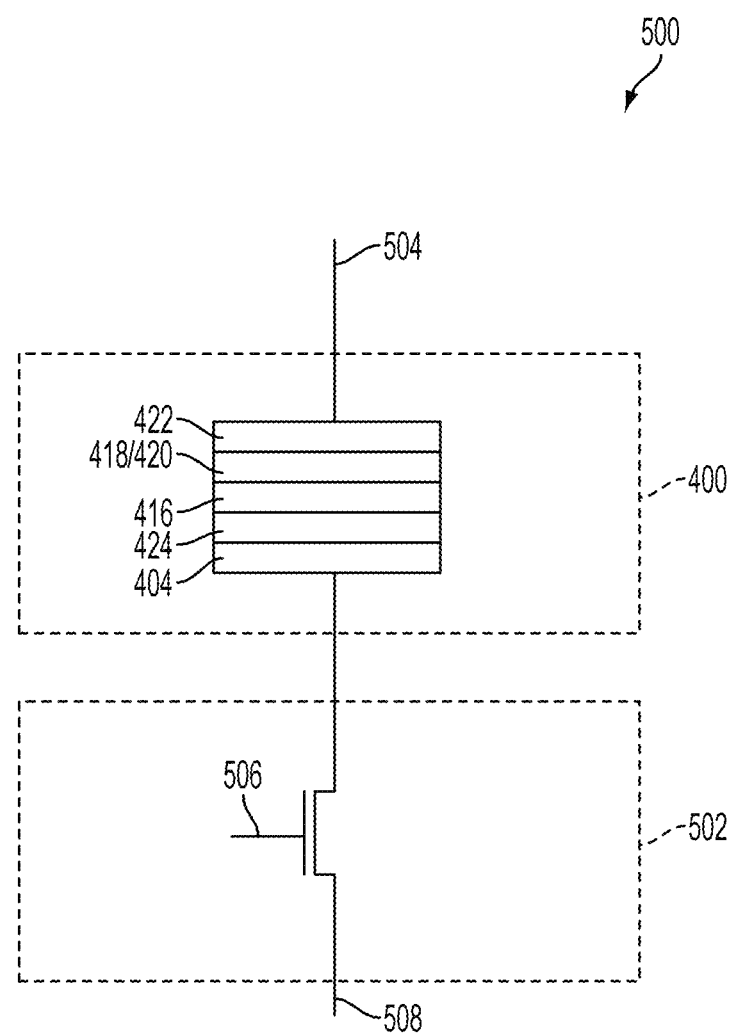
FIG. 5 illustrates a magnetic random access memory (MRAM) cell.

FIG. 5 illustrates a magnetic random access memory (MRAM) cell. An MRAM cell 500 includes the pMTJ structure 400 (also referred to as an MTJ resistor) and an access transistor 502 coupled to the pMTJ structure 400. The pMTJ structure 400 stores a bit of information in the parallel/anti-parallel structure, which is simplified from that shown in FIG. 4. The second electrode 422 is coupled to a bit line 504. The first electrode 404 is coupled to a drain of the access transistor 502. The gate of the access transistor is coupled to a word line 506, and the source of the access transistor 502 is coupled to a source line 508.

The pMTJ structure 400 is simplified by illustrating the SAF structure (also referred to as the pin layer) 424, the barrier layer 416, and the free layer 418/cap layer 420 as the storage portion of the pMTJ structure 400. The access transistor 502 provides write/read access to the pMTJ structure 400. An MRAM cell 500 with one access transistor 502 (T) and one pMTJ structure 400 (J) to store a bit may be referred to as a "1T1J MRAM" cell. As described above, the 1T1J cell uses the access transistor 502 as a selector or switching device and the pMTJ structure 400 as the memory device. The 1T1J MRAM cell may be transistor size dominated (e.g., the access transistor 502 may take up more die area than the pMTJ structure 400 portion of the MRAM cell 500). Further, the 1T1J MRAM cell 500 uses both front end of line (the access transistor 502 portion) and back end of line (the pMTJ structure 400) processes, and thus there are connections between two different processing steps for the MRAM cell 500. The 1T1J MRAM cell 500 can have only one pMTJ structure 400 because the access transistor 502 is within the substrate 402 (fabricated during the front end of line process). These deficiencies limit the density of 1T1J MRAM cells 500 in a memory array.

Figure 6:
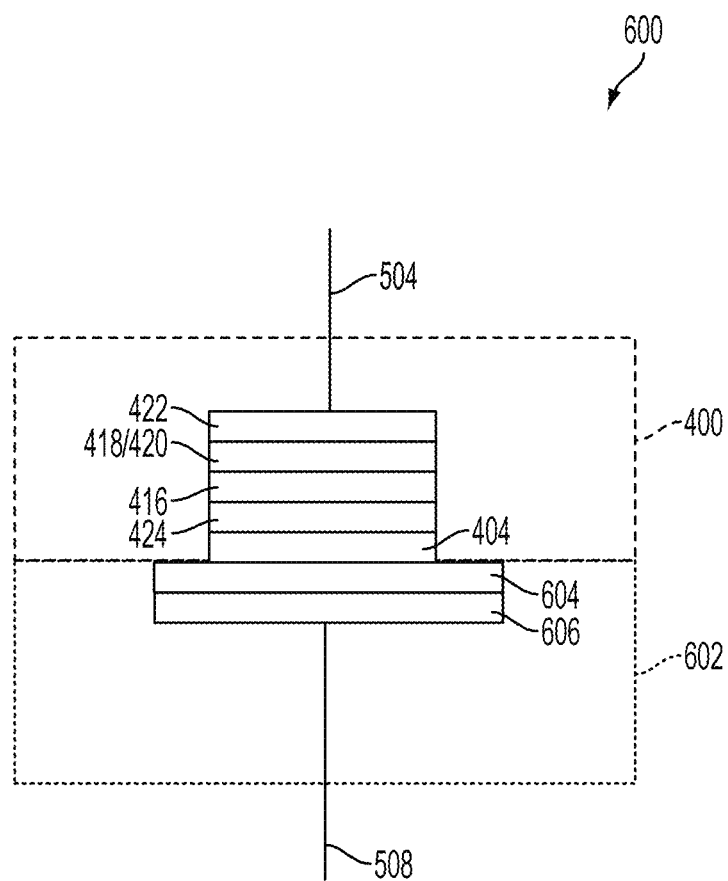
FIG. 6 illustrates an MRAM cell in accordance with an aspect of the present disclosure.

FIG. 6 illustrates an MRAM cell in accordance with an aspect of the present disclosure. In this configuration of the MRAM cell 600, the pMTJ structure 400 is coupled to a selector device 602 instead of the access transistor 502 shown in FIG. 5. The selector device 602 may be a bidirectional selector device configured to bi-directionally access (e.g., write, read) the MTJ stack. An MRAM cell 600, as shown in FIG. 6, may be referred to as a one selector/one junction or "1S1J MRAM cell."

The 1S1J MRAM cell includes a selector layer 604 and an electrode 606. The selector layer 604 has a nonlinear I-V behavior (e.g., a diode I-V behavior). The nonlinear behavior of the selector layer 604, which may be referred to as a selector film, provides reading and switching functions for the MRAM cell 600 while unselecting other cells in the MRAM array.

Because the selector layer 604 and the electrode 606 of the 1S1J MRAM cell 600 are formed within the back end of line process along with the pMTJ structure 400, the MRAM cell 600 can be fabricated and interconnected in a more cost effective manner than the MRAM cell 500. Further, because the selector device 602 in the 1S1J MRAM cell 600 is similar in size to the pMTJ structure 400, the density of cells in a 1S1J MRAM array employing MRAM cells 600 may be improved relative to a 1T1J MRAM array.

The 1S1J MRAM cell 600 can employ multiple ones of the pMTJ structure 400, which may be referred to as a "3D stacked array," for even higher density of a memory array employing the 1S1J MRAM cell 600. For example, the pMTJ structure 400 of FIG. 6 may be stacked one on another to provide two bits of storage within the same surface area of the die.

Figure 7:
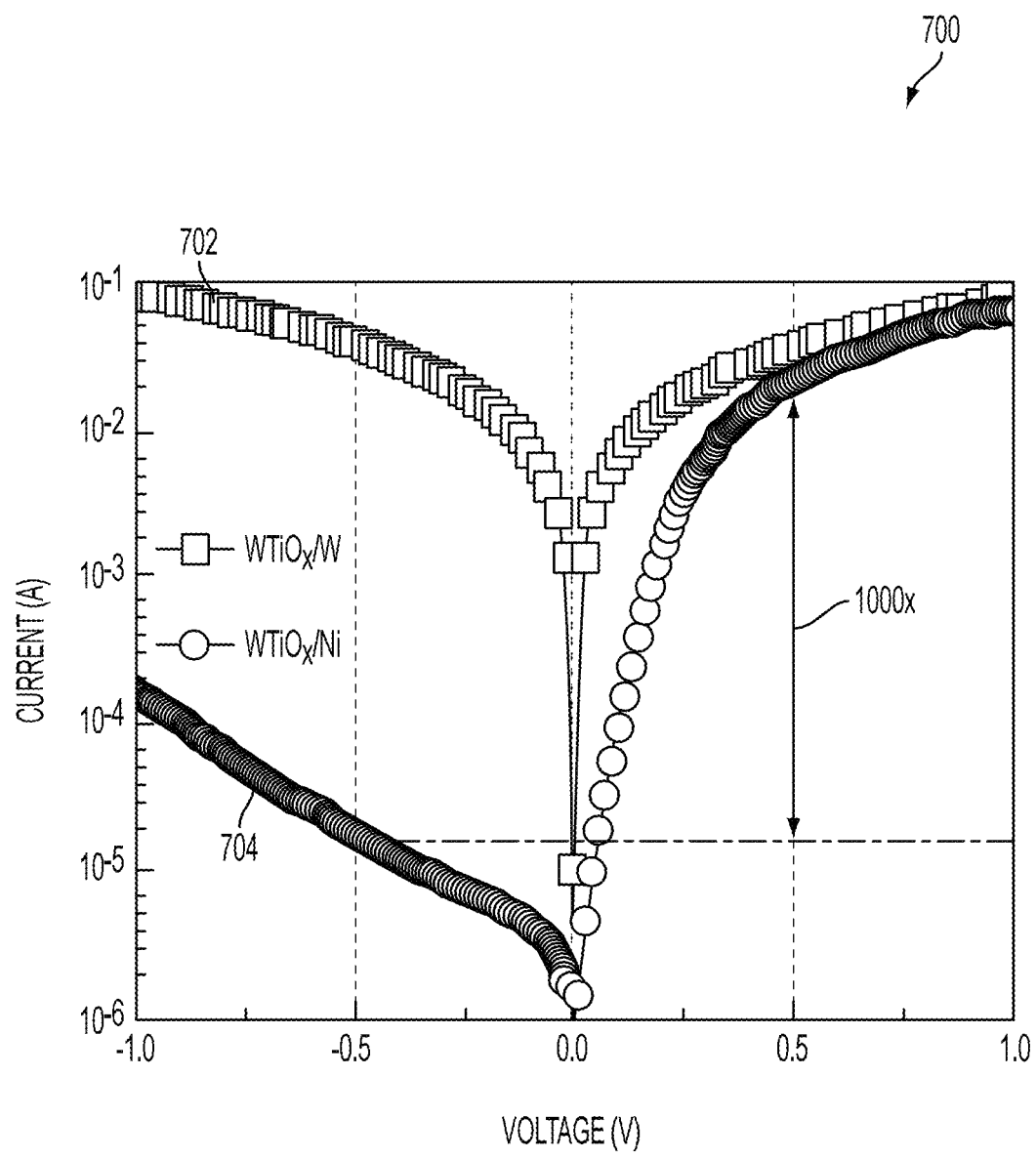
FIG. 7 illustrates a non-linear selector device curve in accordance with an aspect of the present disclosure.

FIG. 7 illustrates a non-linear selector device curve in accordance with an aspect of the present disclosure. A graph 700 illustrates a bidirectional I-V response curve 702, and a unidirectional I-V response curve 704. The large on-current density and low off-state leakage allow for high selectivity of a 1S1J MRAM cell 600 within an array of MRAM cells 600. The bidirectional operation of the devices (e.g., the selector device 602) on the bidirectional I-V response curve 702 allows for use in low current states as well as with bipolar memory elements. The MRAM cells 600 are switched between states or read using current flow in two directions, and thus the bidirectional I-V response curve 702 allows for switching of the MRAM cell 600. A stacked 1S1J MRAM array (e.g., where one of the MRAM cells 600 has more than one pMTJ structure 400 coupled to the selector device 602) may also use a bidirectional I-V response curve 702 for the selector layer 604 rather than a unidirectional I-V response curve 704.

Figure 8:
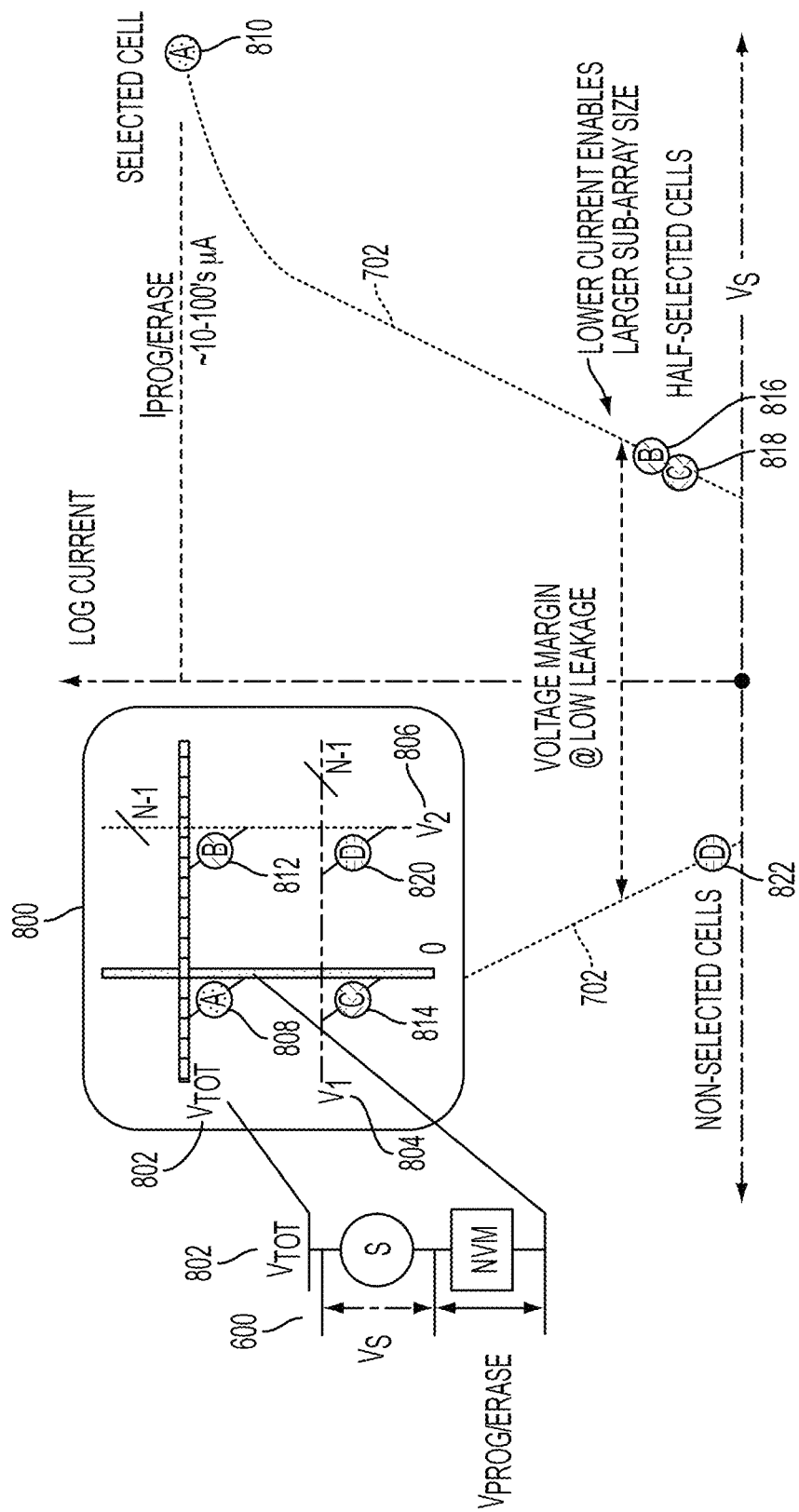
FIG. 8 illustrates operation of a 1S1J memory cell in accordance with an aspect of the present disclosure.

FIG. 8 illustrates operation of a 1S1J memory cell in accordance with an aspect of the present disclosure. In an array 800 of 1S1J MRAM cells 600, a total voltage VTOT 802 is applied to access a particular MRAM cell 600. Because of the array nature of memory cells, other cells in the array 800 may receive voltages as "half-selected" cells. In the array 800, half selected cells receive voltage V1 804 and voltage V2 806. The voltages V1 804 and V2 806 on unselected rows and columns are linked together through the total voltage VTOT 802.

For the selected cell 808, condition 810, which is a high voltage and high current condition "A" is placed on the selected cell 808. For half-selected cells 812 and 814, condition 816 "B" and condition 818 "C" are present. The conditions 816 and 818, because of the non-linear nature of the bidirectional I-V response curve 702, apply a smaller voltage and a lower current to the half-selected cells 812 and 814. This allows for a larger sub-array size within the array 800. For non-selected cells 820, condition 822 "D" exists, which is on the negative side of bidirectional I-V response curve 702. The separation between the conditions 816 and 818 and condition 822 provides the voltage margin for the array 800. The selector device supports high current in the on-state, and has a low leakage through the half/non-selected cells. The half/non-selected cell bias points are fractions of VTOT and not just the selection voltage (VS) because the non-selected cell voltage margin (NVM) voltage as well as any interconnect voltage drop may be taken into account. Because MTJ switch is a digital switch when current is larger than swithing current, half select will not cause MTJ switching or help MTJ switching in later. The 1S1J MRAM cell may use a higher voltage margin for large sub-arrays as non-volatile memory (NVM) voltage specification increase.

Figure 9:
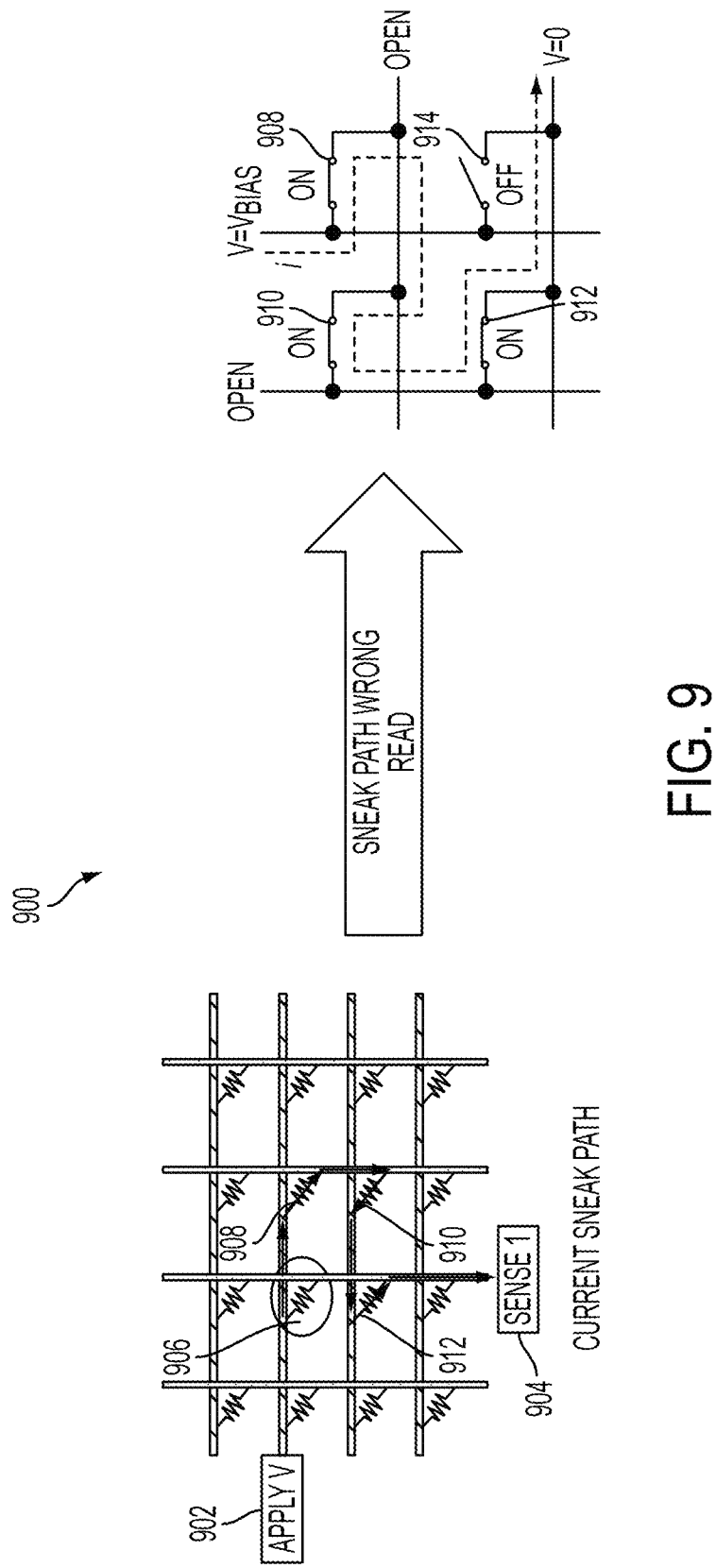
FIG. 9 illustrates a read sneak leakage path for memory cells.

FIG. 9 illustrates a read sneak leakage path for memory cells. In FIG. 9, an array 900 of MRAM cells 600 is shown. A select voltage 902 (as described in FIG. 8) may be applied to a bit line and a current 904 is sensed through an array of pMTJ devices. Because the voltage through half-selected paths are also connected in series with the selected cell, once the selection voltage is applied to a row or column of the array of pMTJ devices, several of the pMTJ devices are placed in series between the applied read voltage and ground. This creates an incorrect reading of the array of pMTJ devices.

For example, and not by way of limitation, as the select voltage 902 is applied to read the MRAM cell 906, the half-selected cell 908 also receives the select voltage 902. The current may then pass through the half-selected cell 908, through the un-selected cell 910, and through the half-selected cell 912 to provide a current path that does not travel through the MRAM cell 906. This "sneak" current path is shown as path 914.

Figure 10:
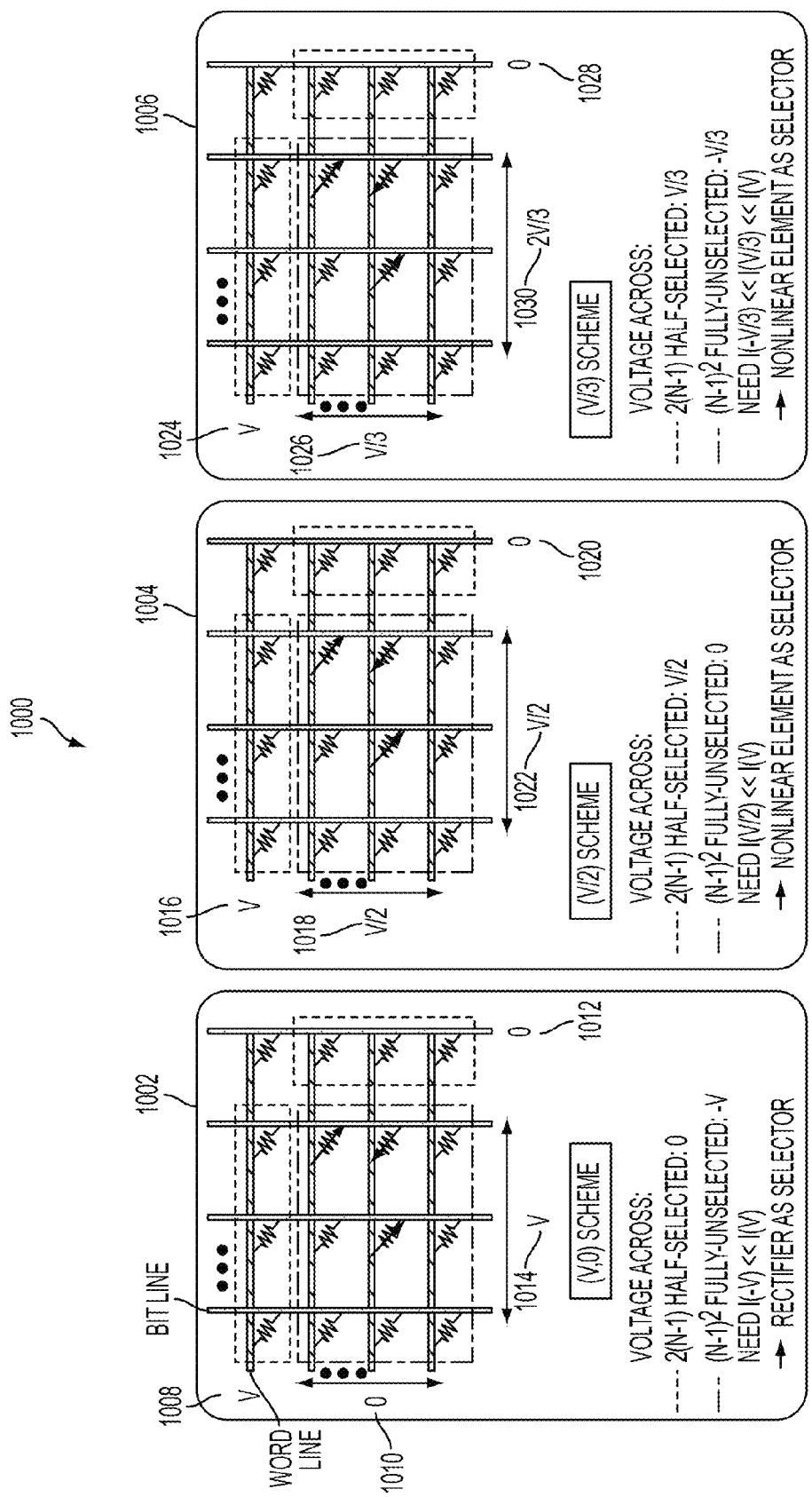
FIG. 10 illustrates aspects of the present disclosure for mitigating the read sneak leakage path shown in FIG. 9.

FIG. 10 illustrates aspects of the present disclosure mitigating the read sneak leakage path shown in FIG. 9. A diagram 1000 illustrates three configurations 1002-1006 that each select different applied voltages to the 1S1J MRAM cell in this aspect of the present disclosure (e.g., v/2, v/3, or some fraction of the voltage used to select a specific row/column/cell). It should be noted that the half-selected and un-selected cells in the array have different voltages applied and thus have different "rest" currents associated with each cell.

In a first configuration 1002, the selector is a rectifier. In the first configuration, voltages 1008-1014 are applied to the various MRAM cells such that one of the cells is read. In a second configuration 1004, the selector is a non-linear element. In the second configuration, voltages 1016-1022 are applied, which may change the materials and characteristics of the selector layer 604. In a third configuration 1006, the selector is also a non-linear element. In the third configuration, voltages 1024-1030 are applied, which also may change the materials and characteristics of the selector layer 604. For example, in the second configuration 1004, the fully unselected cells have an applied voltage of zero, which may provide lower power arrays and/or devices during access operations.

Figure 11:
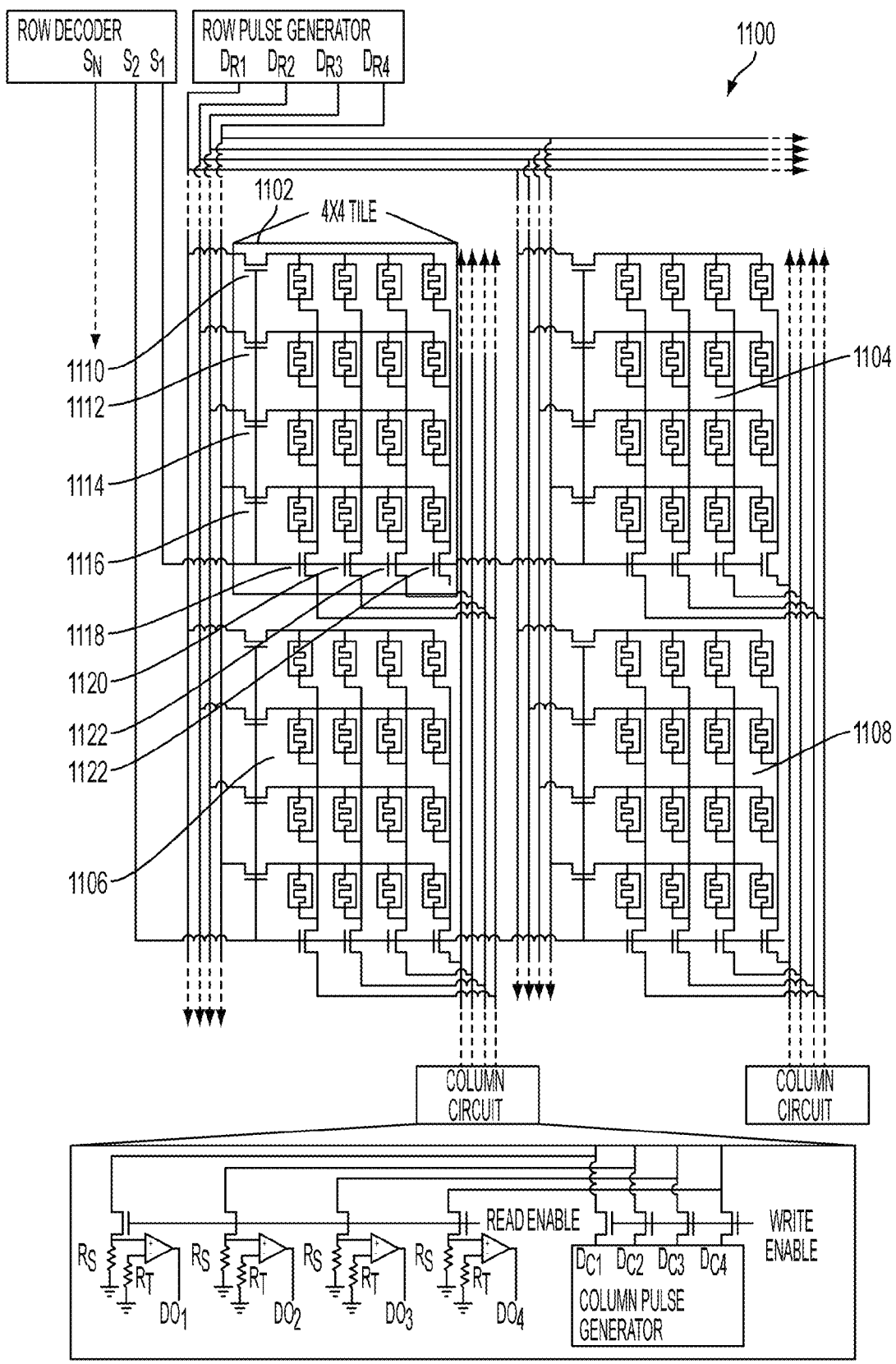
FIG. 11 illustrates a hybrid architecture for the 1S1J MRAM cell of the present disclosure.

FIG. 11 illustrates a hybrid architecture for the 1S1J MRAM cell in one aspect of the present disclosure. In an array 1100, MRAM cells may be arranged in sub-arrays, also called tiles. FIG. 11 illustrates four tiles 1102-1108, although a different number of tiles is also within the scope of the present disclosure. To reduce leakage current, each 4×4 tile 1102-1108, or some other sized tile within an array, of the 1S1J cells may have transistors 1110-1124 for accessing each row/column of the tiles 1102-1108. The transistors 1110-1124 reduce the leakage current from each row/column to the word and bit lines as the corresponding transistors may be fully open when no access to the tile, row, or column occurs.

Figure 12:
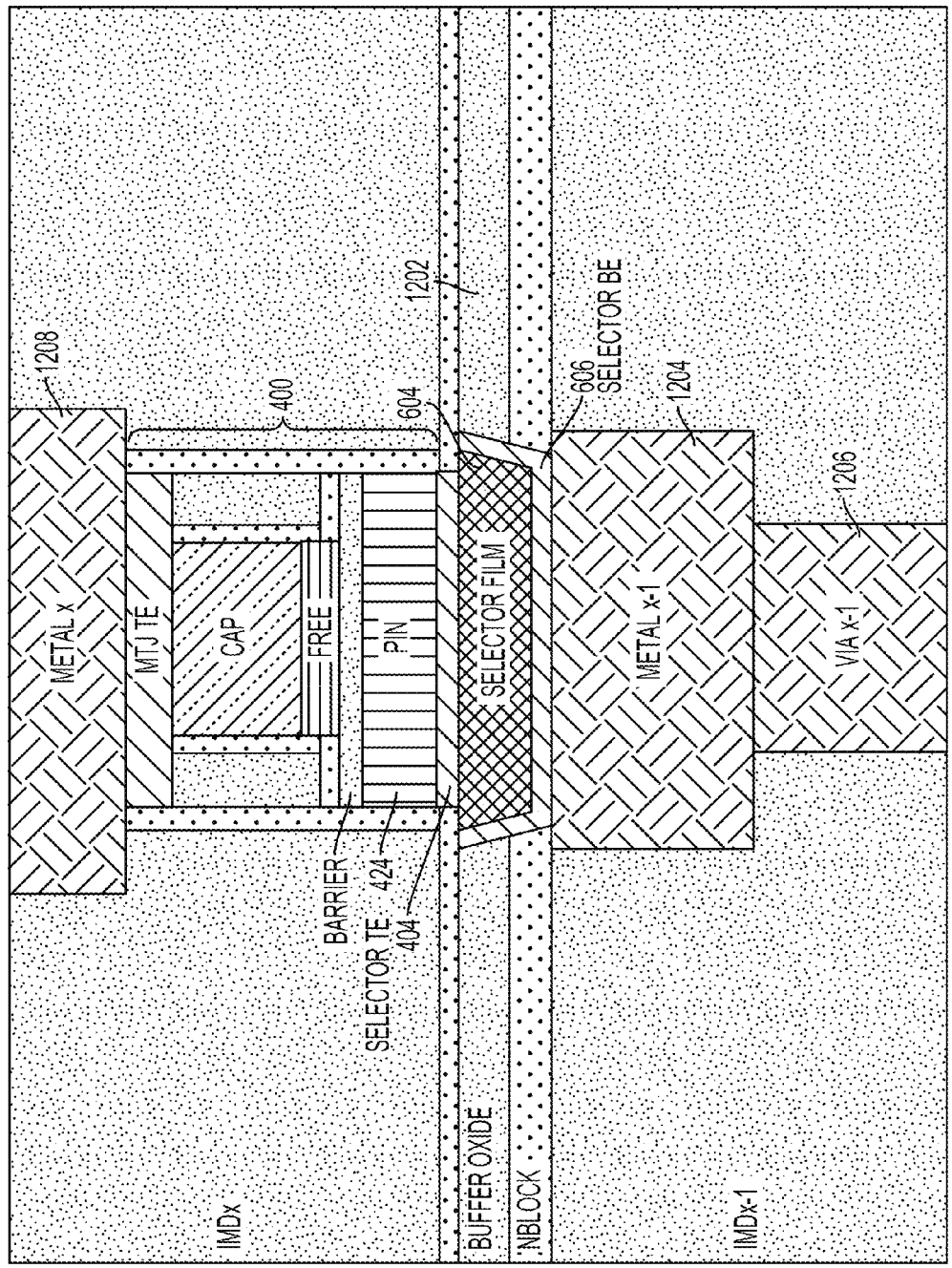
FIGS. 12-15 illustrate structures in accordance with aspects of the present disclosure.
Figure 13:
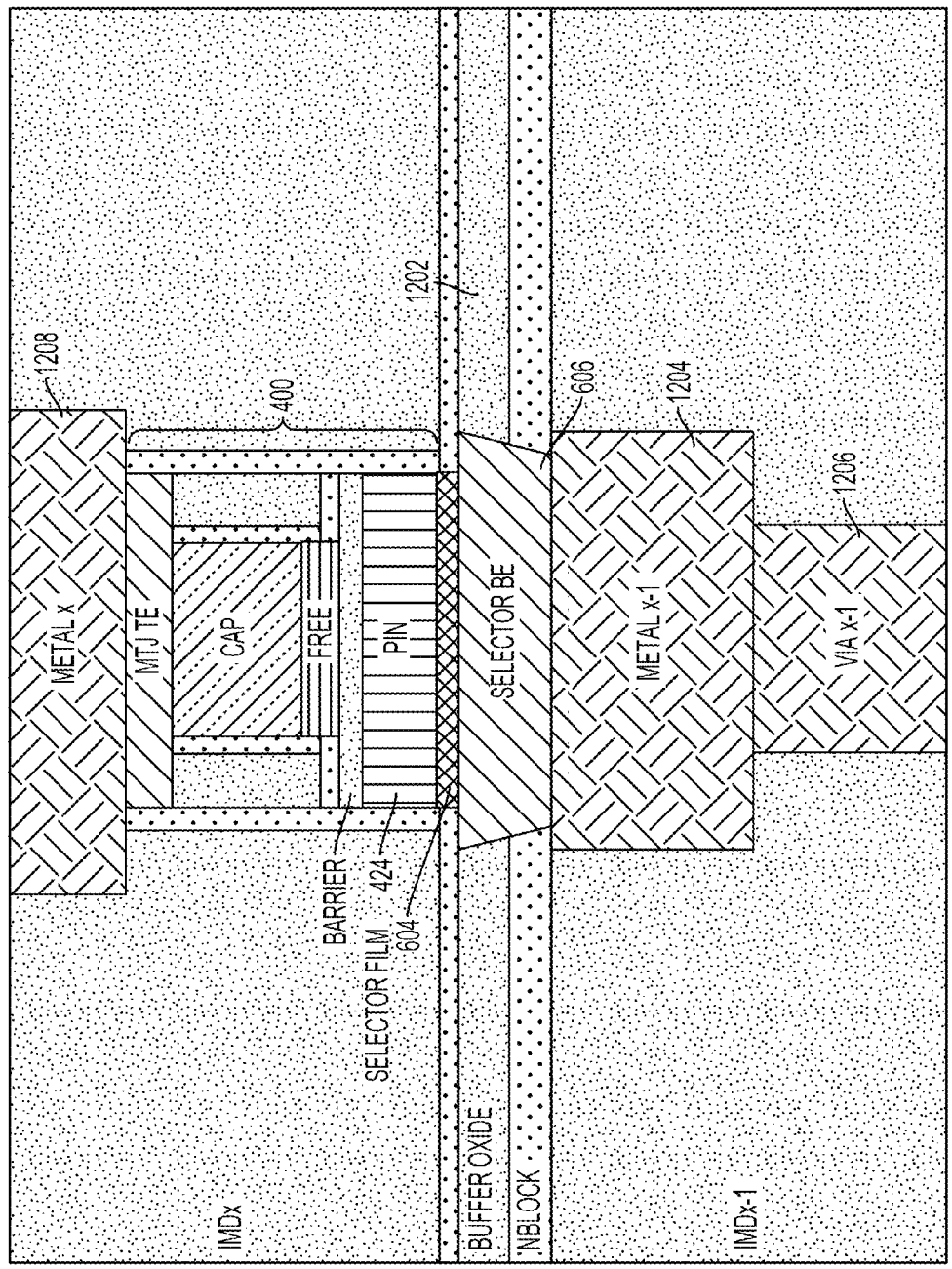
Figure 14:
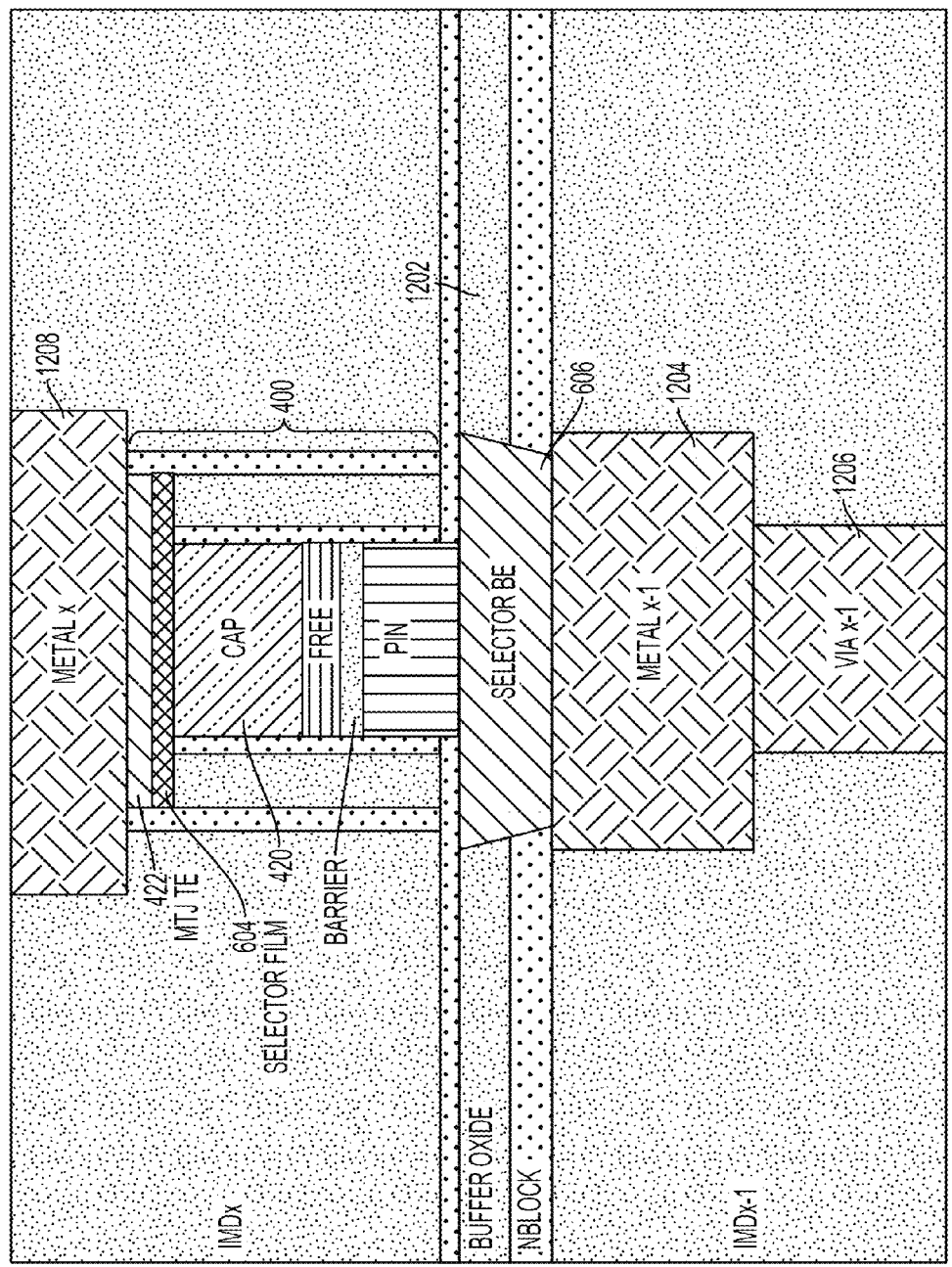
Figure 15:
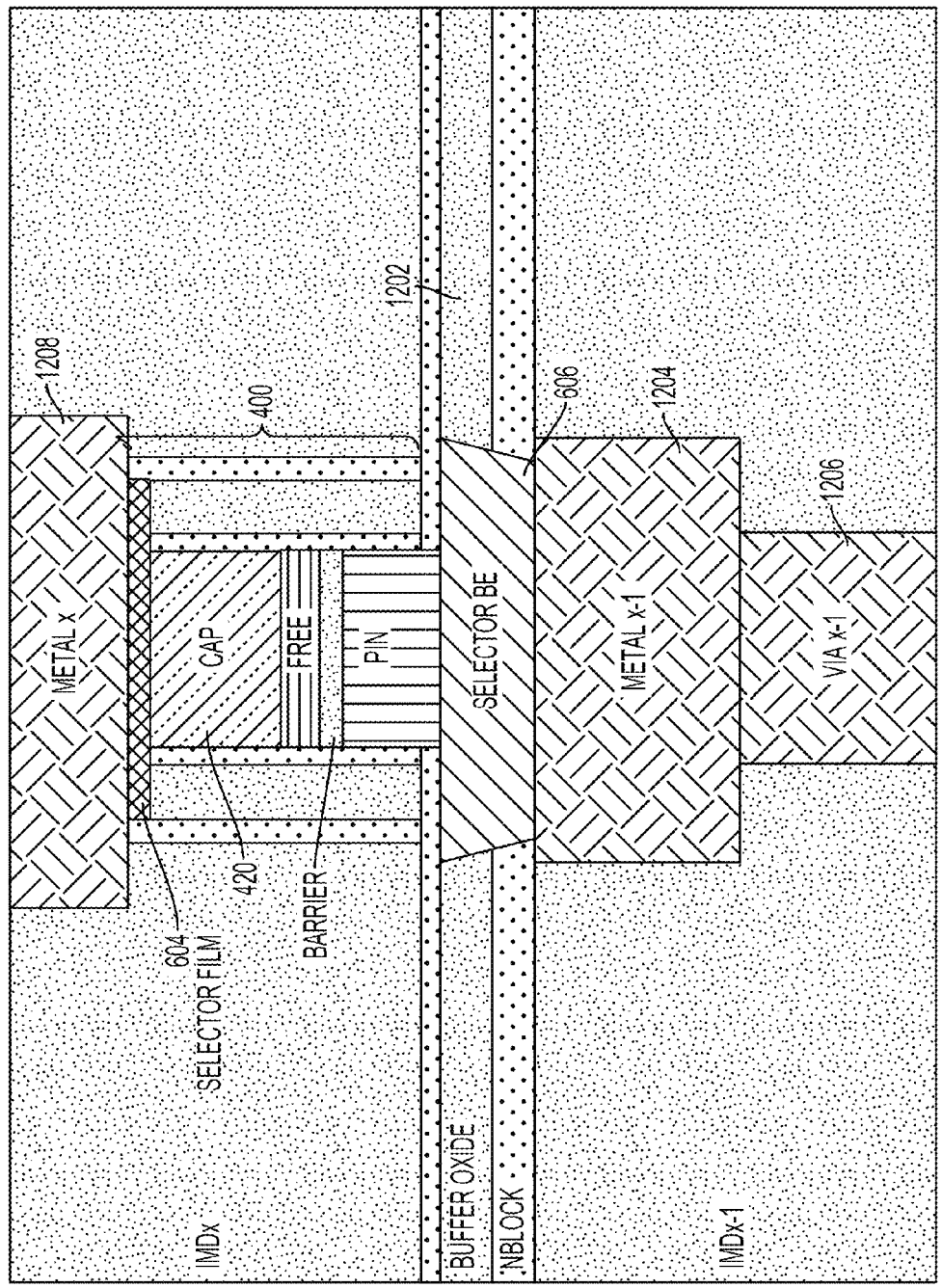

FIGS. 12-15 illustrate structures in accordance with aspects of the present disclosure. As shown in structure 1200 of FIG. 12, the selector layer 604 may be placed in a trench 1202, also referred to as an electrode via, and coupled to the first electrode 404 adjacent the SAF structure 424 of the pMTJ structure 400. The electrode 606 may also lie within the trench 1202. Other conductive layers 1204-1208 within the structure 1200 may be used to access the pMTJ structure 400 and the selector device 602. For example, the first conductive layer 1208 may be the "metal x" or "Mx" layer, which is the x layer in the back end of line process. It is noted that the second electrode (MTJ TE) could be omitted, as could the selector top electrode (TE). In FIG. 12, the pMTJ structure 400 is partially etched. That is, the barrier and pin layers (i.e., SAF structure 424) are not aligned with the free layer. In other configurations, only full etching occurs. That is, the barrier and pin layers are aligned with the free layer, as seen in FIGS. 14 and 15.

As shown in FIG. 13, the selector layer 604 may be coupled directly to the SAF structure 424 of the pMTJ structure 400, and self-aligned to at least a portion of the MTJ (e.g., the SAF structure 424 of the pMTJ structure 400.) The selector electrode (BE) 606 is then placed within the electrode via 1202. Other conductive layers 1204-1208 within the structure 1300 may be used to access the pMTJ structure 400 and the selector device 602. It is noted that the second electrode (MTJ TE) could be omitted. Although not shown, a selector top electrode could be provided between the selector layer 604 and the SAF structure 424. In FIG. 13, the pMTJ structure 400 is partially etched. That is, the barrier and pin layers (i.e., SAF structure 424) are not aligned with the free layer. In other configurations, only full etching occurs. That is, the barrier and pin layers are aligned with the free layer, as seen in FIGS. 14 and 15.

Further, as shown in FIG. 14, the selector layer 604 may be coupled to the cap layer 420 of the pMTJ structure 400, between the cap layer 420 and the second electrode 422. In another configuration, the selector layer 604 is between the second electrode 422 and the first conductive layer 1208. Other conductive layers 1204-1208 within the structure 1400 may be used to access the pMTJ structure 400 and the selector device 602. In FIG. 14, the pMTJ structure 400 is etched at one time. That is, the barrier and pin layers (i.e., SAF structure 424) are aligned with the free layer. In other configurations, only partial etching occurs. That is, the barrier and pin layers are not aligned with the free layer, as seen in FIGS. 12 and 13.

FIG. 15 illustrates that the second electrode 422 of the pMTJ structure 400 may be eliminated, and the selector layer 604 may be coupled directly between the cap layer 420 of the pMTJ structure 400 and a first conductive layer 1208. The first conductive layer 1208 may be the "metal x" or "Mx" layer, which is the x layer in the back end of line process. Other conductive layers 1204-1206 within the structure 1500 may be used to access the pMTJ structure 400 and the selector device 602. In FIG. 15, the pMTJ structure 400 is etched at one time. That is, the barrier and pin layers (i.e., SAF structure 424) are aligned with the free layer. In other configurations, only partial etching occurs. That is, the barrier and pin layers are not aligned with the free layer, as seen in FIGS. 12 and 13. Other structures incorporating the selector film with the stack of the pMTJ structure 400 are envisioned as within the scope of the present disclosure.

Figure 16:
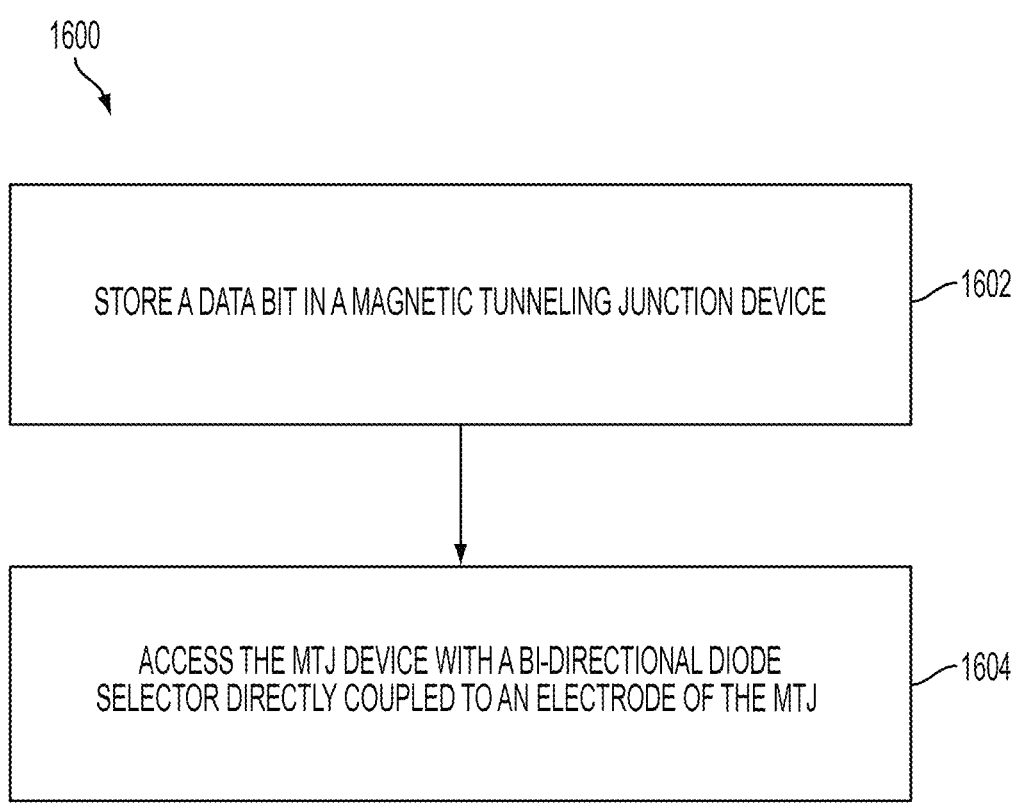
FIG. 16 is a process flow diagram illustrating a process according to an aspect of the present disclosure.

FIG. 16 is a process flow diagram illustrating a method 1600 for storing data according to an aspect of the present disclosure. In block 1602 a data bit is stored in a magnetic tunneling junction (MTJ) device. The MTJ device is shown in FIGS. 4 and 6. In block 1604, the MTJ device is accessed with a bidirectional diode selector directly coupled to an electrode of the MTJ. The bidirectional diode selector is shown and described in FIGS. 6 and 7.

According to a further aspect of the present disclosure, an MRAM cell is described. In one configuration, the device includes means for magnetically storing a data bit. The storing means may be the pMTJ structure 400 shown in FIG. 6. The MRAM cell also includes means for accessing the storing means, directly coupled to the storing means. The accessing means may be the selector device 602 configured for bi-directionally accessing the storing means, for example, as shown in FIG. 6. In another aspect, the aforementioned means may be any module or any apparatus configured to perform the functions recited by the aforementioned means.

Figure 17:
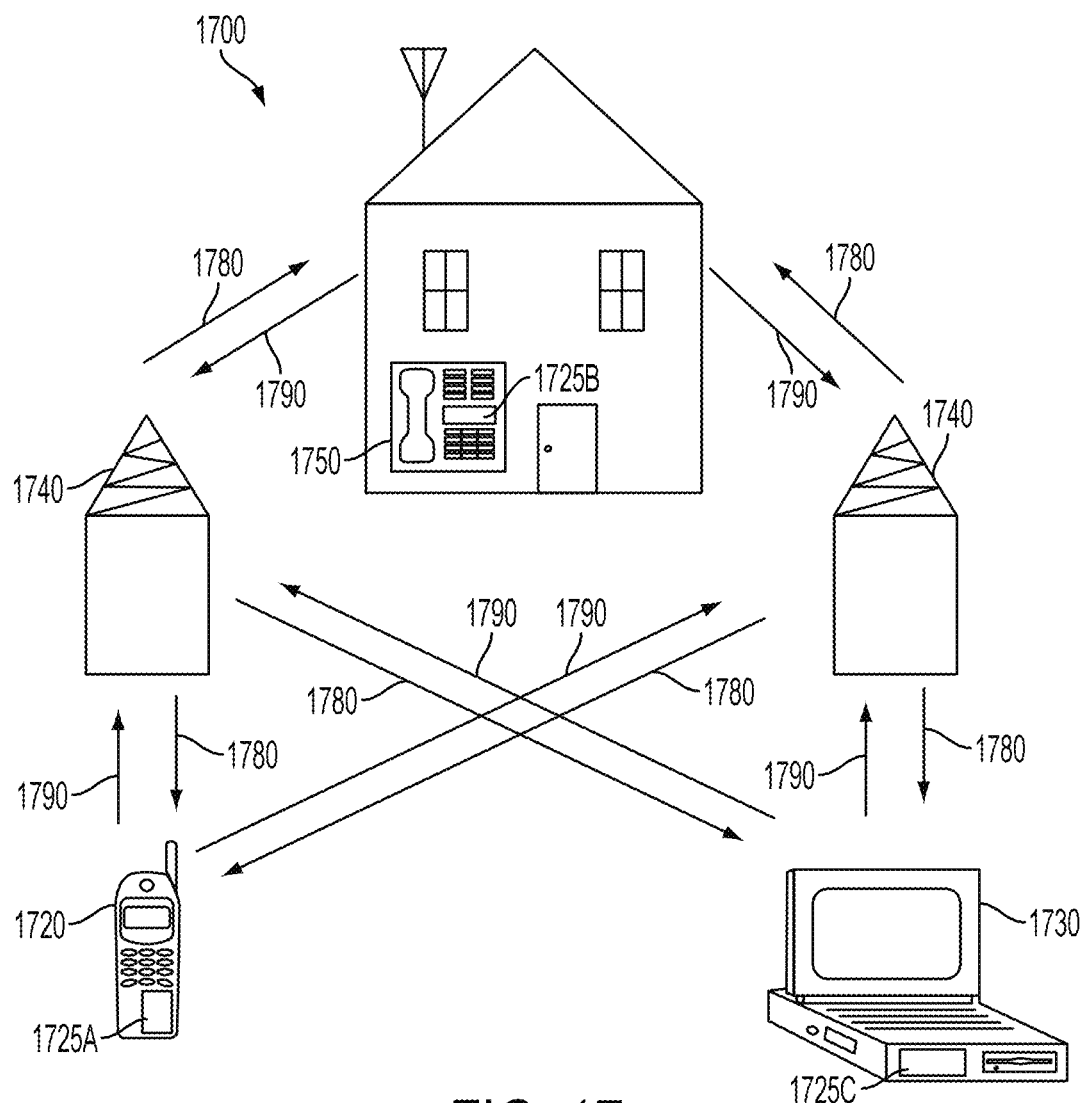
FIG. 17 is a block diagram showing an exemplary wireless communication system in which a configuration of the disclosure may be advantageously employed.

FIG. 17 is a block diagram showing an exemplary wireless communication system 1700 in which an aspect of the disclosure may be advantageously employed. For purposes of illustration, FIG. 17 shows three remote units 1720, 1730, and 1750 and two base stations 1740. It will be recognized that wireless communication systems may have many more remote units and base stations. Remote units 1720, 1730, and 1750 include IC devices 1725A, 1725C, and 1725B that include the disclosed MRAM. It will be recognized that other devices may also include the disclosed MRAM devices, such as the base stations, switching devices, and network equipment. FIG. 17 shows forward link signals 1780 from the base station 1740 to the remote units 1720, 1730, and 1750 and reverse link signals 1790 from the remote units 1720, 1730, and 1750 to base stations 1740.

In FIG. 17, remote unit 1720 is shown as a mobile telephone, remote unit 1730 is shown as a portable computer, and remote unit 1750 is shown as a fixed location remote unit in a wireless local loop system. For example, the remote unit may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 17 illustrates remote units according to the aspects of the disclosure, the disclosure is not limited to these exemplary illustrated units. Aspects of the disclosure may be suitably employed in many devices, which include the disclosed MRAM devices.

Figure 18:
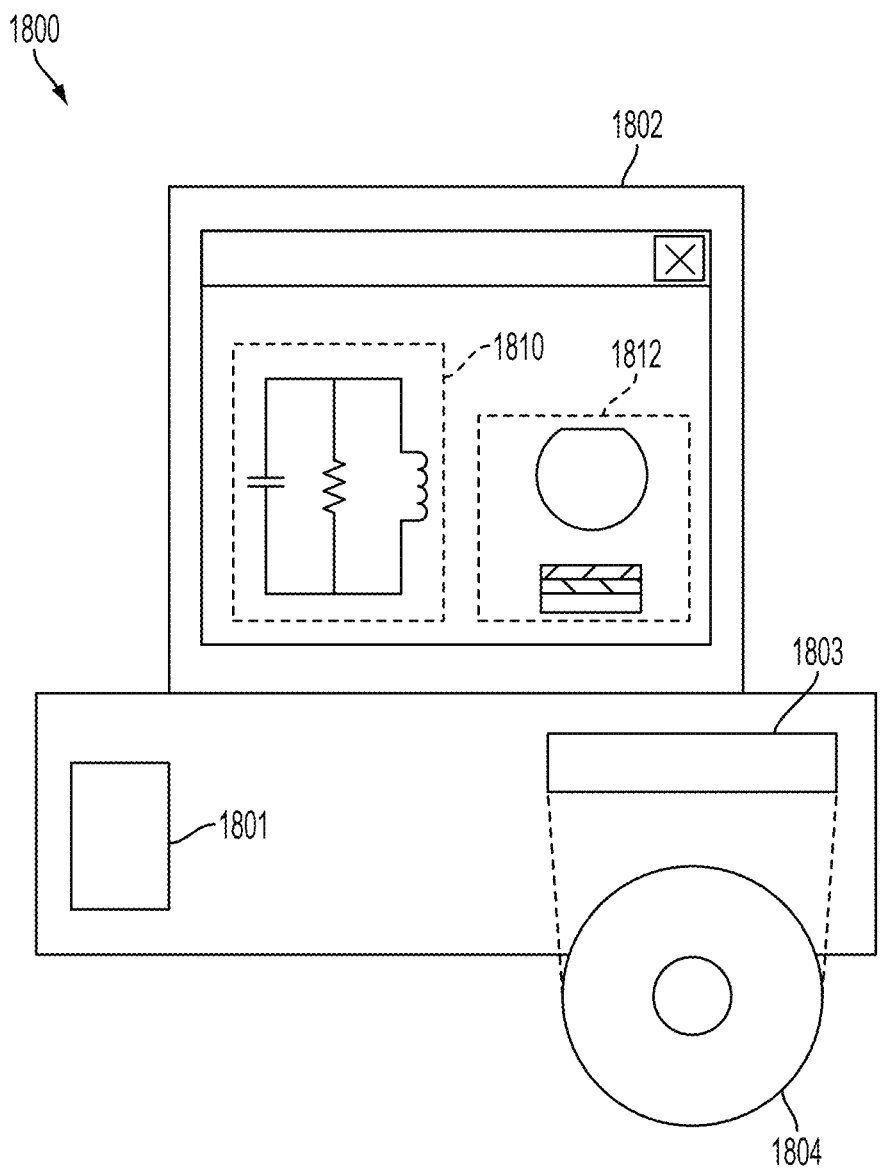
FIG. 18 is a block diagram illustrating a design workstation used for circuit, layout, and logic design of a semiconductor component according to one configuration.

FIG. 18 is a block diagram illustrating a design workstation used for circuit, layout, and logic design of a semiconductor component, such as the MRAM devices disclosed above. A design workstation 1800 includes a hard disk 1801 containing operating system software, support files, and design software such as Cadence or OrCAD. The design workstation 1800 also includes a display 1802 to facilitate design of a circuit 1810 or a semiconductor component 1812 such as an MRAM device in accordance with an aspect of the present disclosure. A storage medium 1804 is provided for tangibly storing the design of the circuit 1810 or the semiconductor component 1812. The design of the circuit 1810 or the semiconductor component 1812 may be stored on the storage medium 1804 in a file format such as GDSII or GERBER. The storage medium 1804 may be a CD-ROM, DVD, hard disk, flash memory, or other appropriate device. Furthermore, the design workstation 1800 includes a drive apparatus 1803 for accepting input from or writing output to the storage medium 1804.

Data recorded on the storage medium 1804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1804 facilitates the design of the circuit 1810 or the semiconductor component 1812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although aspects of the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be used according to aspects of the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A magnetic random access memory (MRAM) cell, comprising:
    a magnetic tunneling junction (MTJ) comprising a pin layer, a barrier layer, a free layer, and a capping layer; and
    a bidirectional diode selector, comprising a selector electrode directly coupled to the pin layer, and a selector layer directly coupled to the capping layer of the MTJ, to enable access to the MTJ.

2. The MRAM cell of claim 1, in which the selector electrode of the bidirectional diode selector directly supports the pin layer of the MTJ.

3. The MRAM cell of claim 2, in which the selector layer of the bidirectional diode selector is self-aligned to an MTJ electrode.

4. The MRAM cell of claim 1, in which the selector layer of the bidirectional diode selector is directly on the capping layer of the MTJ.

5. The MRAM cell of claim 1, in which the selector layer of the bidirectional diode selector comprises a conductive film.

6. The MRAM cell of claim 1, in which the bidirectional diode selector has a non-linear selector characteristic.

7. The MRAM cell of claim 1, within an MRAM cell array, coupled to a plurality of access transistors.

8. The MRAM cell of claim 1, within a first MRAM layer, stacked on another MRAM layer.

9. The MRAM cell of claim 1 integrated into a mobile phone, a set top box, a music player, a video player, an entertainment unit, a navigation device, a computer, a hand-held personal communication systems (PCS) unit, a portable data unit, and/or a fixed location data unit.

10. A magnetic random access memory (MRAM) cell, comprising:
    a magnetic tunneling junction (MTJ) comprising a pin layer, a barrier layer, a free layer, and a capping layer; and
    a bi-directionally diode selector, directly coupled to one of the pin layer, the barrier layer, the free layer or the capping layer of the MTJ, in which the bi-directionally diode selector is within an electrode via of the MTJ.

11. A magnetic random access memory (IVIRAM) cell, comprising:
    a magnetic tunneling junction (MTJ) comprising a pin layer, a barrier layer, a free layer, and a capping layer; and
    means for bi-directionally accessing the MTJ, in which the means for bi-directionally accessing comprises a selector electrode directly coupled to the pin layer, and a selector layer directly coupled to the capping layer of the MTJ.

12. The MRAM cell of claim 11, in which the accessing means is directly to the capping layer of the MTJ.

13. The MRAM cell of claim 11, in which the accessing means has a non-linear selector characteristic.

14. The MRAM cell of claim 11 integrated into a mobile phone, a set top box, a music player, a video player, an entertainment unit, a navigation device, a computer, a hand-held personal communication systems (PCS) unit, a portable data unit, and/or a fixed location data unit.

15. A method for storing data in a magnetic random access memory (MRAM) cell, comprising:
    a step for storing a memory bit in a magnetic tunneling junction (MTJ) device, the MTJ device comprising a pin layer, a barrier layer, a free layer, and a capping layer; and
    a step for accessing the MTJ device with a selector electrode directly coupled to the pin layer, and a selector layer directly coupled to the capping layer of the MTJ.

16. The method of claim 15, further comprising a step for integrating the MRAM cell into a mobile phone, a set top box, a music player, a video player, an entertainment unit, a navigation device, a computer, a hand-held personal communication systems (PCS) unit, a portable data unit, and/or a fixed location data unit.

17. A method for storing data in a magnetic random access memory (MRAM) cell, comprising:
    storing a memory bit in a magnetic tunneling junction (MTJ) device, the MTJ device comprising a pin layer, a barrier layer, a free layer, and a capping layer; and
    accessing the MTJ device with a selector electrode directly coupled to the pin layer, and a selector layer directly coupled to the capping layer of the MTJ.

18. The method of claim 17, further comprising integrating the MRAM cell into a mobile phone, a set top box, a music player, a video player, an entertainment unit, a navigation device, a computer, a hand-held personal communication systems (PCS) unit, a portable data unit, and/or a fixed location data unit.

* * * * *

UNITED STATES PATENT AND TRADEMARK OFFICE
CERTIFICATE OF CORRECTION

PATENT NO.        : 9,461,094 B2
APPLICATION NO.   : 14/334554
DATED             : October 4, 2016
INVENTOR(S)       : Xia Li et al.

Page 1 of 1

It is certified that error appears in the above-identified patent and that said Letters Patent is hereby corrected as shown below:

In the Claims

Claim 11, beginning at Column 18, Line 1 through Column 18, Line 10 should read:

11. A magnetic random access memory (MRAM) cell, comprising:
  a magnetic tunneling junction (MTJ) comprising a pin layer, a barrier layer, a free layer, and a capping layer; and
  means for bi-directionally accessing the MTJ, in which the means for bi-directionally accessing comprises a selector electrode directly coupled to the pin layer, and a selector layer directly coupled to the capping layer of the MTJ.

Signed and Sealed this
Twenty-seventh Day of December, 2016

Michelle K. Lee
*Director of the United States Patent and Trademark Office*